(12) United States Patent
Tao et al.

(10) Patent No.: US 6,590,344 B2
(45) Date of Patent: Jul. 8, 2003

(54) SELECTIVELY CONTROLLABLE GAS FEED ZONES FOR A PLASMA REACTOR

(75) Inventors: Shun-Jan Tao, Hsinchu (TW); Huan-Just Lin, Hsin-Chu (TW); Mong-Song Liang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/003,492

(22) Filed: Nov. 20, 2001

(65) Prior Publication Data

US 2003/0094903 A1 May 22, 2003

(51) Int. Cl.[7] .................................................. H01J 7/24
(52) U.S. Cl. ........................ 315/111.21; 313/231.31; 34/258; 118/723
(58) Field of Search ................ 315/111.21, 111.71, 315/111.91, 111.81; 204/298.07, 298.26, 298.33, 298.39; 313/231.31; 34/258, 565, 651; 118/715, 723; H01J 7/24

(56) References Cited

U.S. PATENT DOCUMENTS

| | | | | |
|---|---|---|---|---|
| 5,115,116 A | * | 5/1992 | Reed | 219/202 |
| 5,470,784 A | * | 11/1995 | Coleman | 438/61 |
| 5,522,934 A | * | 6/1996 | Suzuki et al. | 118/723 AN |
| 5,650,693 A | * | 7/1997 | Campbell et al. | 315/111.21 |
| 5,900,103 A | * | 5/1999 | Tomoyasu et al. | 156/345.44 |
| 6,008,139 A | * | 12/1999 | Pan et al. | 438/730 |
| 6,159,297 A | * | 12/2000 | Herchen et al. | 118/708 |
| 6,200,431 B1 | * | 3/2001 | Sone | 204/192.12 |
| 6,251,187 B1 | * | 6/2001 | Li et al. | 118/715 |
| 6,284,673 B2 | * | 9/2001 | Dunham | 438/758 |
| 6,338,313 B1 | * | 1/2002 | Chan | 118/723 I |
| 6,449,871 B1 | * | 9/2002 | Kholodenko et al. | 34/255 |

* cited by examiner

*Primary Examiner*—Don Wong
*Assistant Examiner*—Trinh Do Dinh
(74) *Attorney, Agent, or Firm*—Tung & Associates

(57) ABSTRACT

A gas distribution system for improving asymmetric etching and deposition control over a substrate diameter in a plasma reactor including a plasma reactor chamber further including a substrate holder for holding a substrate surface disposed in a lower portion of said plasma reactor; at least one gas distributor disposed within the plasma reactor chamber for distributing reactant gases where at least one gas distributor including a plurality of gas feed zones in communication with at least one gas source for selectively delivering a gas flow independently to at least one of the plurality of gas feed zones.

19 Claims, 3 Drawing Sheets

SELECTIVELY CONTROLLABLE GAS FEED ZONES FOR A PLASMA REACTOR

FIELD OF THE INVENTION

This invention generally relates to a gas feed system for a plasma CVD and/or etching apparatus and more particularly to a gas feed system including selectively controllable zones.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

While there are many methods for depositing material in VLSI and ULSI technology, these methods maybe broadly classified into chemical vapor deposition (CVD) and physical vapor deposition (PVD). CVD is defined as the formation of a nonvolatile solid film on a substrate by the reaction of vapor phase reactants that contain the required chemical constituents of the solid film. The most common CVD deposition methods are atmospheric pressure CVD (APCVD), low pressure CVD (LPCVD), and plasma enhanced CVD (PECVD). PECVD is a preferred method where lower temperatures are required.

The CVD process includes, among other reaction steps, transport of the reactants to the surface of the substrate and reaction at the substrate surface. Depending on process parameters such as temperature and pressure, the deposition rate is primarily affected by parameters that affect the slowest reaction step and is frequently classified as either reaction limited or mass transport limited. However, even if the deposition rate is reaction limited, the surface reaction rate is affected by local non uniformities in gas phase reactant concentrations resulting in depletion non-uniformities and consequently film non-uniformities. On the other hand, if the deposition rate is mass-transport limited, it is crucial that the flux of gas phase reactant to the surface is uniform across the deposition substrate, for example, a semiconductor wafer. Thus, in either case uniformity in gas phase concentrations over the deposition substrate affects film uniformity.

For example, PECVD uses RF power to generate a glow discharge (plasma) thereby imparting energy to the reactants, allowing the deposition to occur at a lower temperature compared to APCVD or LPCVD depositions. As a result, PECVD depositions are generally reaction limited. Generally, free electrons are generated under the influence of RF energy and are accelerated by an electric field to collide with gas phase molecules thereby creating ions which may in turn be accelerated toward the substrate where they adsorb and rearrange to form a deposited solid film.

As feature geometries shrink, uniform CVD film deposition is increasingly important and more difficult to achieve. For example, gap filling performance is an increasingly significant issue. Gap fill performance generally refers to the ability of a process to fill an etched feature opening, for example, trenches between metal lines. A process known as HDP-CVD is increasingly used since the plasma may be used for both CVD process and etching, allowing both process to be used to achieve critical dimension control of semiconductor features. Generally, both process take place simultaneously, resulting in a deposition/sputter ratio (D/S/) ratio that may be adjusted according to process parameters. In HDP-CVD, a bias power is coupled to the substrate to attract ions which sputter (etch) the substrate during deposition, thereby preventing a phenomena known as crowning where the deposition material converges over the trench before the trench is completely filled with the deposition material. The deposition rate may therefore be more finely tuned to improved CVD deposition properties to, for example, avoid crowning.

As wafer sizes increase, etch/deposition uniformity has become increasingly harder to achieve in plasma reactors, for example, PECVD or HDP-CVD reactors. Nonuniformity in etching and deposition is typically exhibited across the diameter of process wafer with the greatest differences at the center and at the edges (circumference) of the process wafer. Consequently, semiconductor features exhibit asymmetric dimensions caused by etching or deposition non-uniformities. One example where asymmetric etching or deposition can have debilitating effects on device performance is, for example, in the manufacture of gate structures where gate oxide thickness and gate length dimensions are critical for proper device performance. In many cases, no more than a few nanometers of nonuniformity (critical dimension bias) across an individual device can be tolerated.

According to the prior art, efforts to address etch/deposition nonuniformity have focused on adjusting the power level of the RF power antenna (excitation source), for example, in an inductively coupled plasma source, a single or dual TCP (transformer coupled plasma), typically disposed outside the reactor chamber adjacent to a dielectric window through which power is transmitted to the reactor gases. In addition, efforts have been made to gain better control of the substrate temperature, for example, by including a dual temperature control on the electrostatic chuck (ESC) that holds the substrate.

It has been found, however, that the gas transport characteristics within a plasma reactor are the most sensitive variable contributing to etch/deposition non-uniformities. There have been a variety of gas feed systems proposed for plasma reactors however, many of them have unacceptable shortcomings. For example, U.S. Pat. No. 5,522,934 to Suzuki et al. discloses a gas injector arrangement including a plurality of gas supply nozzles positioned in a plurality of levels in a direction substantially perpendicular to the substrate. The gas supply nozzles at upper levels extend further toward the center of the substrate than those at lower levels. The injection holes are located at the distal ends of the gas supply nozzles. These systems are effective in delivering the process gas to the region above the substrate. However, because the conduits extend over the substrate surface between the substrate and the primary ion generation region, as the ions diffuse from the generation region toward the substrate the conduits can cast shadows of ion nonuniformity onto the substrate surface. This can lead to an undesirable loss in etch and deposition uniformity.

In addition, other gas feed systems for plasma reactors have included top gas feed arrangement where the gas feed is fed from the top of the reactor chamber toward the substrate surface. Further, arrangements have included, for example, gas feeds centrally located at the top of the chamber including shower head feed arrangements. Further, the prior art has disclosed gas feeds that are centrally located in the upper chamber including one or more gas feeds and which can be directed at a variety of angles generally toward the substrate surface. Gas feed systems according to the prior art, however, lack a system to readily adjust the gas feed characteristics selectively over an area including the full diameter of the process wafer. For example, centrally located adjustable angle gas feed systems including a plurality of adjustable orifices present problems by creating complex patterns of interfering streams of gas thereby creating convective transport non-uniformities between the central portion of the process wafer and the peripheral portion. In addition non-uniformities over the diameter of the process wafer may be created since proper reactant mixing has not fully occurred.

There is therefore a need in the semiconductor processing art to develop adjustable gas feed systems whereby gas transport conditions for a plasma reactor including CVD or etching processes may be readily optimized over the diameter of the semiconductor wafer.

It is therefore an object of the invention to provide a method and apparatus including an adjustable gas feed system whereby gas transport conditions for a plasma reactor including CVD or etching processes may be readily optimized over the diameter of the semiconductor wafer while overcoming other shortcomings and deficiencies in the prior art.

SUMMARY OF THE INVENTION

To achieve the foregoing and other objects, and in accordance with the purposes of the present invention, as embodied and broadly described herein, the present invention provides a gas distribution system for improving asymmetric etching and deposition control over a substrate diameter in a plasma reactor.

In a first embodiment according to the present invention, The gas distribution system includes a plasma reactor chamber further comprising a substrate holder for holding a substrate surface disposed in a lower portion of said plasma reactor; at least one gas distributor disposed within the plasma reactor chamber for distributing reactant gases said at least one gas distributor including a plurality of gas feed zones in communication with at least one gas source for selectively delivering a gas flow independently to at least one of the plurality of gas feed zones.

In a related embodiment, the at least one gas distributor includes the plurality of gas feed zones disposed in an upper portion of the plasma reactor. Further, the at least one gas distributor includes a plurality of gas exit orifices oriented to face the substrate surface to extend over a diameter at least about equal to the substrate surface diameter.

In another embodiment the plurality of gas feed zones further comprises a plurality of radially concentric gas feed zones.

In yet another embodiment, the plurality of gas feed zones are in gaseous communication with at least one selectively controllable gas flow source equipped with at least one selectively controllable gas flow controller.

In a related embodiment, at least one gas mixer is disposed between the at least one selectively controllable gas flow source and the plurality of gas feed zones including a gas flow controller downstream of the at least one gas mixer to selectively control a gas feed rate to the at least one gas feed zone.

In another embodiment, a selectively controllable valve for delivering gas flow to the at least one gas feed zone is disposed downstream of the at least one gas mixer.

In yet a further embodiment, the plurality of gas feed zones includes at least one centrally disposed gas feed zone and at least one peripherally disposed gas feed zone. Further, the at least one centrally disposed gas feed zone and the at least one peripherally disposed gas feed zone are independently supplied with reactant gases. Further yet, the at least one centrally disposed gas feed zone and the at least one peripherally disposed gas feed zone are supplied with reactant gases in parallel.

In a different embodiment, the at least one gas distributor includes a top gas distributor disposed in an upper portion of the plasma reactor chamber and a bottom gas distributor disposed in a lower portion of the plasma reactor chamber. Further, the bottom gas distributor further comprises an annular shape disposed below and peripheral to the substrate holder. Further yet, the bottom gas distributor includes a plurality of gas exit orifices oriented perpendicular to the substrate surface to face toward the upper portion of the plasma reactor chamber.

In a related embodiment the top gas distributor and bottom gas distributor are supplied by at least one selectively controllable gas source.

In another related embodiment, the top gas distributor and bottom gas distributor are supplied by at least one gas mixer disposed downstream of the at least one selectively controllable gas source.

In another related embodiment, the top gas distributor and bottom gas distributor are supplied by at least one selectively controllable valve disposed downstream of the at least one gas mixer.

In other related embodiments, the at least one gas distributor includes a plurality of radially concentric gas zones that are flowably isolated from one another. Further, the radially concentric gas zones include a plurality of circumferentially spaced gas injectors. Further yet, the radially concentric gas zones are controllably supplied by one or more sources of mixed gaseous reactants.

In yet a further related embodiment, the at least one gas distributor includes a top gas distributor disposed in the upper portion of the plasma reaction chamber above the substrate and a bottom gas distributor disposed in the lower portion of the plasma reaction chamber below and peripheral to the substrate holder circumference.

These and other embodiments, aspects and features of invention will be better understood from a detailed description of the preferred embodiments of the invention which are further described below in conjunction with the accompanying Figures.

DETAILED DESCRIPTION OF THE PREFERRED EMBODIMENTS

Figure 1A:
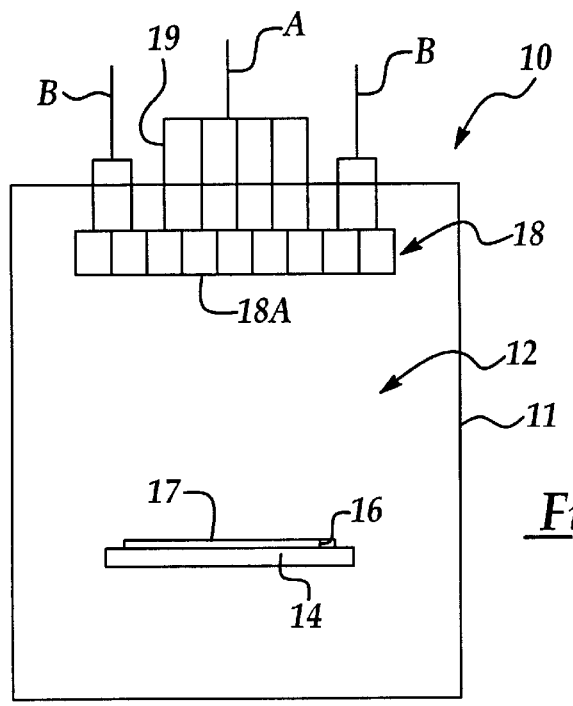
FIGS. 1A to 1C are schematic representations of a plasma reactor including a portion of the gas distribution system of the present invention.

Referring to FIG. 1, a portion of a gas distribution system is shown disposed in an exemplary plasma reactor 10 including a housing 11 defining a vacuum chamber 12. The plasma reactor 10 may be any plasma reactor including a vacuum pumping system (not shown) to control the ambient pressure and one or more RF power sources (not shown) to ignite plasma. The plasma reactor chamber may be part of a PECVD system or an HDPCVD system. The plasma reactor 10 is preferably equipped for both etching and CVD although it may be equipped for primarily etching or primarily CVD operations. A substrate support 14 is disposed within the vacuum chamber, for example, centrally located at the bottom portion of the vacuum chamber for holding substrate 16, for example, an electrostatic or mechanical chuck. The substrate support 14 may include an electrode (not shown) for biasing the substrate surface. A gas distributor 18, preferably disk shaped, is disposed in an upper part of the vacuum chamber, the outlet surface 18A being arranged parallel with the substrate surface 17. Preferably, the gas distributor 18 has an outlet surface 18A that has a cross sectional area parallel to the substrate surface 17 that is at least as large as a diameter of the substrate surface 17. It will be appreciated that other geometric shapes such as rectangular may be used for the gas distributor 18.

Figure 1B:
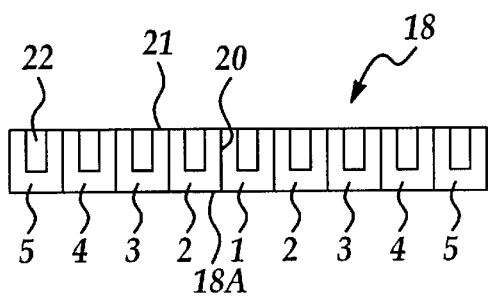

Turning to FIG. 1B, gas distributor 18 preferably includes a plurality of gas injectors e.g., 22, for example, orifice containing nozzles, housed within the gas distributor 18 behind gas distributor the outlet surface 18A of gas distributor 18. Gas outlet surface 18A may be for example, a flat surface containing gas outlet surface orifices (not shown) to allow the passage of gas exiting from gas injectors e.g., 22. The gas injectors 22 e.g., 22 are arranged so as to feed a plurality of concentric radial zones e.g., 1, 2, 3, 4, and 5 included in gas distributor 18. The gas injectors e.g., 22 may be cylindrical and equipped with one or more orifices (not shown), for example, having one or more gas injector orifices at the distal end adjacent gas outlet surface 18A and/or arranged along the cylinder surface of gas injectors e.g., 22. The gas injector orifices may vary in dimension, for example, being graded from a larger diameter along the cylinder surface to a smaller diameter at the distal end. For example, the gas injector orifices may have diameters from about 0.25 mm to about 1 mm. Gas outlet surface 18A is adjacently spaced from the distal ends of the gas injectors e.g., 22 and includes a plurality of outlet surface orifices (not shown) through which gas exiting the gas injectors may pass. The outlet surface 18A, for example, includes outlet surface orifices opening into the vacuum chamber arranged on the outlet surface 18A in a circumferential pattern. The outlet surface orifices, for example, may have diameters from about 0.25 mm to about 1 mm.

Figure 1C:
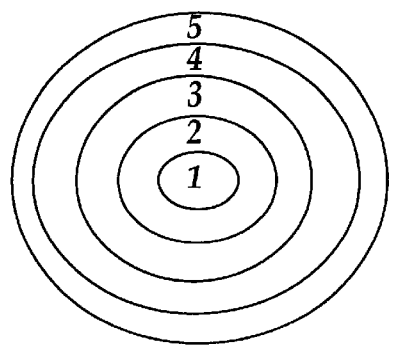

The gas injectors 22 are arranged to form a plurality of radial zones in the gas distributor 18. For example, FIG. 1C shows an overhead view of gas distributor 18 showing radial zones e.g., 1, 2, 3, 4, and 5 forming radially concentric areas disposed in gas distributor 18. Referring again to FIG. 1B showing a side view of gas distributor 18, the radial zones e.g., 1, 2, 3, 4, and 5 are preferably separated with a separator wall plate e.g., 20 extending between the gas outlet surface 18A and back plate 21 of gas distributor 18 to provide gaseous isolation between concentric radial zones e.g., 1, 2, 3, 4, and 5. Referring to FIG. 1A, preferably, a plurality of gas manifold lines e.g., 19, supplied by gas feed lines, e.g., A and B, are arranged in gaseous communication with and gas injectors 22, supply reactant gases to each of the radial zones 1, 2, 3, 4, and 5, and may be, for example, annularly shaped to fit within the radial zones.

According to the present invention, a plurality of gas feed lines are fed into the plasma reactor, for example near the top portion of the vacuum chamber, in gaseous communication with the gas injectors 22 housed within radial zones e.g., 1, 2, 3, 4, and 5. Preferably, the gas feed lines include at least one gas feed line, more preferably two gas feed lines, for example, gas feed line A and gas feed line B. The gas feed lines A and B are preferably supplied to one or more, preferably a central portion e.g., radial zones 1, 2, and 3 and a peripheral portion, e.g., radial zones 4 and 5 of gas distributor 18.

Figure 2A:
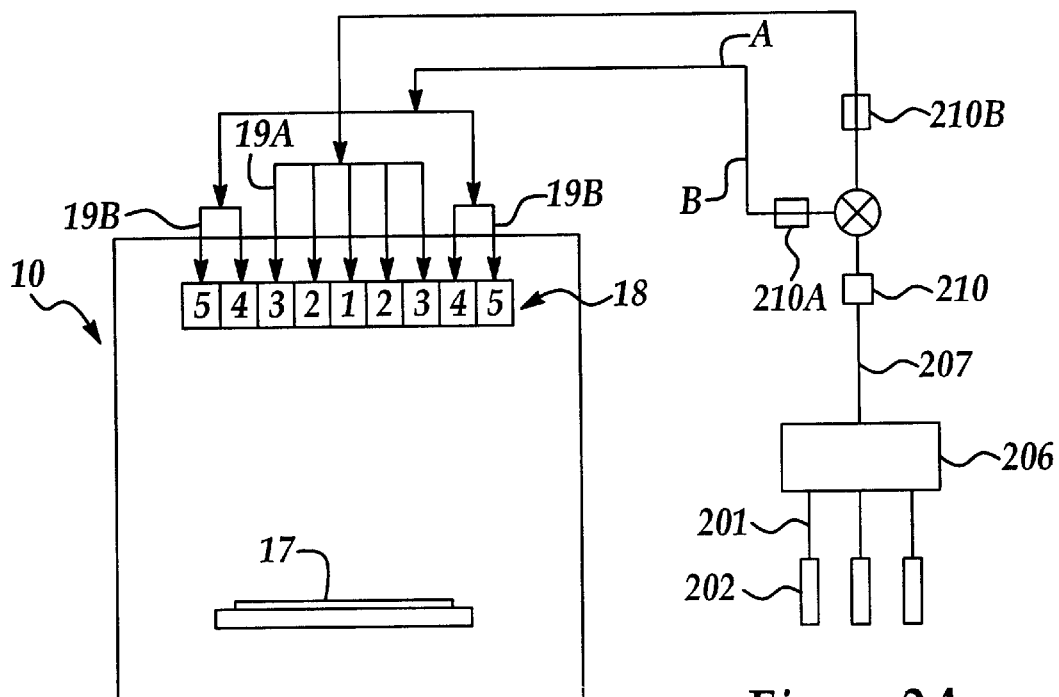
FIGS. 2a and 2B are schematic representations of a plasma reactor including a gas distribution system according to embodiments of the present invention.

In one embodiment of the present invention, referring to FIG. 2A, gas supply lines e.g., 201 carry etching gases from gas sources e.g., 202 to at least one gas mixer, for example gas mixer 206, where the etching gases are thoroughly mixed. The mixed gases are then carried by gas supply line 207 to at least one valve, for example, valve 208, which may be selectively opened to supply, for example, gas feed lines A and B. In addition, at least one flow controller 210 including a flow sensor may be disposed either prior to valve 208, or in gas feed lines A and B, e.g., flow controller 210A and flow controller 210B, to selectively control the flow rate of reactant gases supplied to one or more radial zones in gas distributor 18. For example, gas feed line A is in gaseous communication with gas manifold lines e.g., 19A to supply gas injectors (not shown) circumferentially disposed in radial zones 1, 2, and 3. Gas line B, for example, is in gaseous communication with gas manifold lines e.g., 19B to supply gas injectors (not shown) circumferentially disposed in peripheral radial zones 4 and 5. Thus, according to the first embodiment, gases may be selectively supplied according to a selected flow rate to different radial zones of gas distributor 18, allowing thereby, the convective properties and concentrations of reactive gases impinging at substrate surface 17 to be selectively controlled.

Figure 2B:
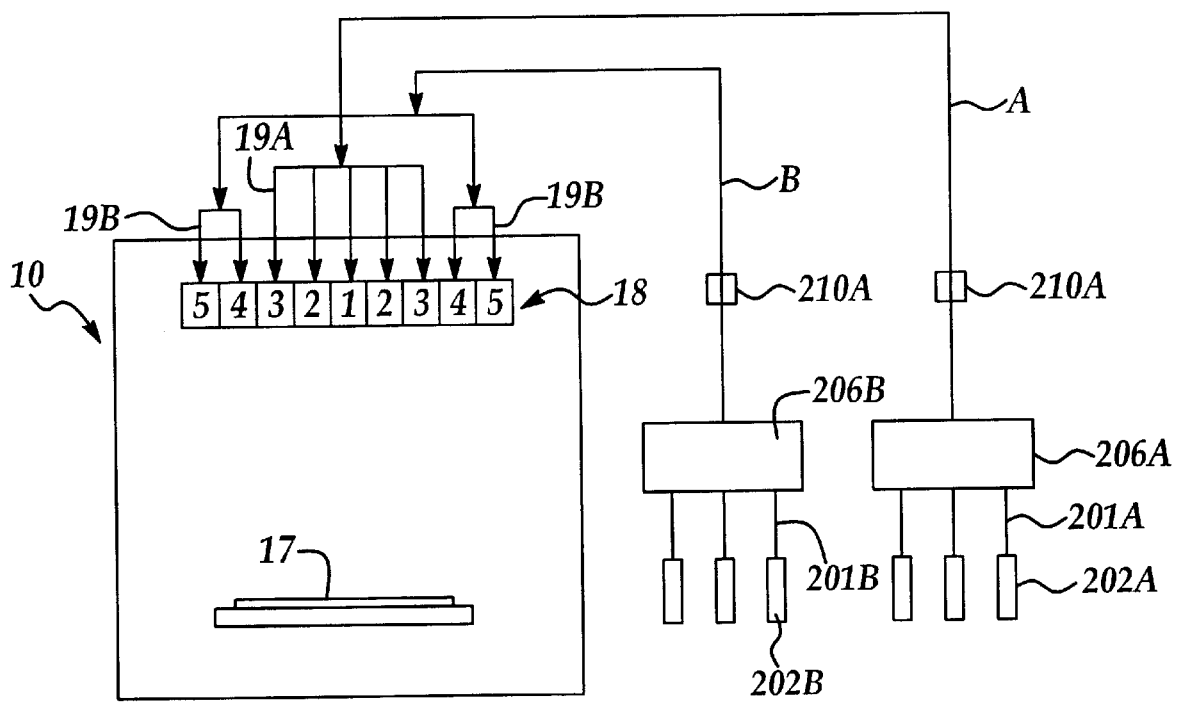

In a second embodiment according to the present invention, reactant gases are supplied to more than one gas mixer. For example, as shown in FIG. 2B, gas mixer 206A and Gas mixer 206B independently supply reactive gases to gas distributor 18 by gas feed lines A and B. Gas mixers 206A and 206B are independently supplied with gas sources, e.g., 202A and 202 B by gas supply lines e.g., 201A and 201B, respectively. As with the first embodiment, one or more of the plurality of radial zones may be supplied by one or more gas feed lines. Flow controllers, for example, 210A and 210B including flow sensors (either mass or pressure), are preferably disposed in gas feed lines A and B downstream of gas mixers 206A and 206B to selectively control the flow rate of reactant gases supplied to gas distributor 18. In this embodiment, for example gas feed line A is in gaseous communication with gas manifold lines, e.g., 19A to supply gas injectors (not shown) circumferentially disposed in radial zones 1, 2, and 3. Gas line B, for example, is in gaseous communication with gas manifold lines e.g., 19B to supply gas injectors (not shown) circumferentially disposed in peripheral radial zones 4 and 5. Thus, reactant gases, in for example a CVD process are thoroughly mixed in separate gas mixers (without reaction) and selectively supplied to radial gas zones disposed over the substrate for distribution to the substrate surface 17 for reaction, thereby allowing selective control of feed rates of reactive gases over selected portions of the diameter of the substrate surface 17.

Figure 2C:
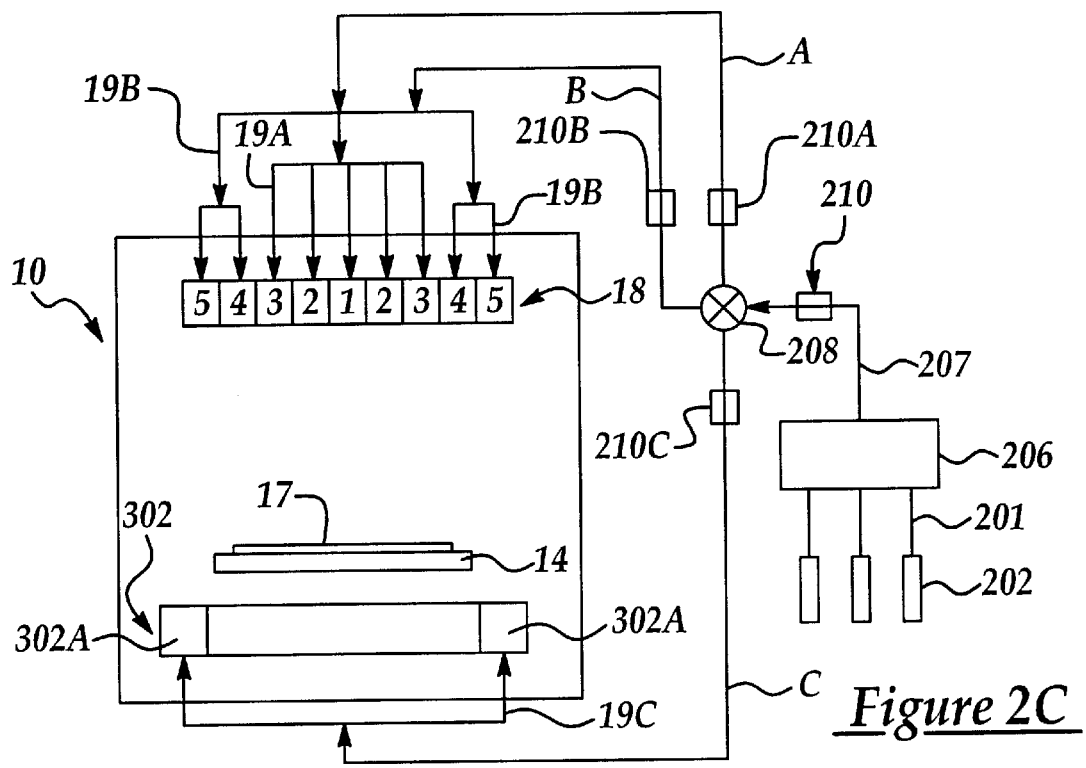
FIGS. 2C and 2D are schematic representations of a plasma reactor including a gas distribution system according to further embodiments of the present invention.

In a third embodiment according to the present invention, as shown in FIG. 2C, reactant gases are supplied to both the upper and lower portions of the plasma reactor 10. For example, as with the first embodiment, gas feed line A supplies the centrally disposed zones, e.g., 1, 2, and 3 in gas distributor 18 (top gas distributor). In this embodiment, however, gas feed line B, for example supplies a gas distributor 302 (bottom gas distributor) disposed in the lower portion of plasma reactor 10. Gas distributor 302, for example, may have the same design as gas distributor 18, however, gas distributor 302 is preferably annularly shaped including at least one radial peripheral zone, for example, radial zone 302A. Gas distributor 302, is preferably disposed so that the radial zone 302A is disposed below and peripheral to the diameter of substrate support 14. The mixed gases are carried from gas mixer 206 by gas supply line 207 to valve 208, which may be selectively opened to supply, for example, gas feed lines A, B, and C. In addition, flow controllers 210 is disposed upstream of valve 208 in gas supply line 207 and flow controllers 210A, 210B and 210C including flow sensors are preferably disposed in gas feed lines A, B, and C downstream of gas mixer 206 to control the flow rate of reactant gases supplied to gas distributors 18 and 302 via gas manifold lines 19A, 19 B and 19C, respectively. Optionally, for example, gas feed line B may be closed via valve 208 to stop gas supply to peripheral radial zones 4 and 5, supplying peripheral gas by radial zones 302A from bottom gas distributor 302. In this embodiment, supplying reactant gases from the lower portion of the chamber allows improved control over the etching and/or deposition properties along the substrate surface 17 circumference.

Figure 2D:
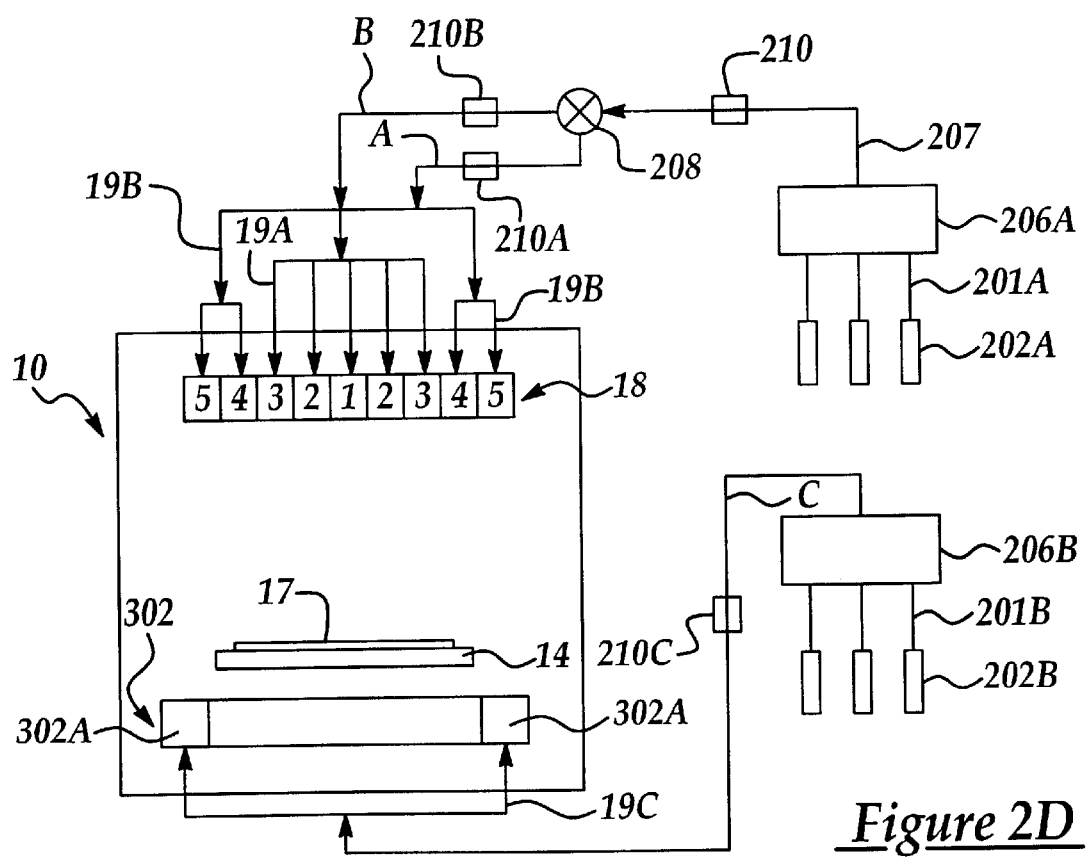

In a fourth embodiment, as shown in FIG. 2D, reactant gases are supplied to both the upper and lower portions of the plasma reactor by using more than one gas mixer. For example, two or more gas mixers, for example, 206A and 206B supply gas distributors 18 and 302. In this example, gas mixer 206A supplies valve 208 which is selectively opened to feed either or both gas feed lines A and B. Gas feed lines A, in turn optionally supplies the centrally disposed zones, e.g., 1, 2, and 3 via gas manifold lines e.g., 19A and gas feed line B optionally supplies peripherally disposed zones, e.g., 4 and 5 via gas manifold lines, e.g., 19B. In addition, gas mixer 206B optionally supplies gas feed line C, which in turn supplies gas distributor 302 via manifold lines e.g., 19C. In addition, flow controller 210 is disposed upstream of valve 208 in gas supply line 207 and flow controllers 210A, 210B and 210C including flow sensors are preferably disposed in gas feed lines A, B, and C downstream of gas mixers 206A and 206B to control the flow rate of reactant gases supplied to gas distributors 18 and 302 via gas manifold lines 19A, 19B and 19C, respectively. Optionally, for example, gas feed line B may be closed via valve 208 to stop gas supply to peripheral radial zones 4 and 5, supplying peripheral gas by radial zones 302A from bottom gas distributor 302. In this embodiment, supplying thoroughly mixed reactant gases from the lower portion of the chamber allows improved control over the etching and/or deposition properties along the substrate surface 17 circumference.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A gas distribution system for improving asymmetric etching and deposition control over a substrate diameter in a plasma reactor comprising:
   a plasma reactor chamber further comprising a substrate holder for holding a substrate surface disposed in a lower portion of said plasma reactor;
   at least one gas distributor disposed within the plasma reactor chamber for distributing reactant gases, said at least one gas distributor comprising a plurality of gas feed zones in communication with at least one gas source for selectively delivering a gas flow independently to at least one of the plurality of gas feed zones wherein the at least one gas distributor further comprises a top gas distributor disposed in an upper portion of the plasma reactor chamber and a bottom gas distributor disposed in a lower portion of the plasma reactor chamber.

2. The gas distribution system of claim 1, wherein the at least one gas distributor includes the plurality of gas feed zones disposed in an upper portion of the plasma reactor.

3. The gas distribution system of claim 1, wherein the top gas distributor includes a plurality of gas exit orifices oriented to face the substrate surface to extend over a diameter at least about equal to the substrate surface diameter.

4. The gas distribution system of claim 1, wherein the plurality of gas feed zones further comprises a plurality of radially concentric gas feed zones.

5. The gas distribution system of claim 1, wherein the plurality of gas feed zones are in gaseous communication with at least one selectively controllable gas flow source equipped with at least one selectively controllable gas flow controller.

6. The gas distribution system of claim 5, wherein at least one gas mixer is disposed between the at least one selectively controllable gas flow source and the plurality of gas feed zones including a gas flow controller downstream of the at least one gas mixer to selectively control a gas feed rate to the plurality of gas feed zones.

7. The gas distribution system of claim 6, wherein, a selectively controllable valve for delivering gas flow to the plurality of gas feed zones is disposed downstream of the at least one gas mixer.

8. The gas distribution system of claim 7, wherein the plurality of gas feed zones includes at least one centrally disposed gas feed zone and at least one peripherally disposed gas feed zone.

9. The gas distribution system of claim 8, wherein the at least one centrally disposed gas feed zone and the at least one peripherally disposed gas feed zone are independently supplied with reactant gases.

10. The gas distribution system of claim 8, wherein the at least one centrally disposed gas feed zone and the at least one peripherally disposed gas feed zone are supplied with reactant gases in parallel.

11. The gas distribution system of claim 1, wherein the bottom gas distributor is disposed below and peripheral to the substrate holder circumference.

12. The gas distribution system of claim 1, wherein the bottom gas distributor includes a plurality of gas exit orifices oriented perpendicular to the substrate surface to face toward the upper portion of the plasma reactor chamber.

13. The gas distribution system of claim 1, wherein the top gas distributor and the bottom gas distributor are supplied by at least one selectively controllable gas source.

14. The gas distribution system of claim 13, wherein the top gas distributor and the bottom gas distributor are supplied by at least one gas mixer disposed downstream of the at least one selectively controllable gas source.

15. The gas distribution system of claim 14, wherein the top gas distributor and the bottom gas distributor are supplied by at least one selectively controllable valve disposed downstream of the at least one gas mixer.

16. The gas distribution system of claim 1, wherein the at least one gas distributor includes a plurality of radially concentric gas zones that are flowably isolated from one another.

17. The gas distribution system of claim 16, wherein the radially concentric gas zones include a plurality of circumferentially spaced gas injectors.

18. The gas distribution system of claim 17, wherein the radially concentric gas zones are controllably supplied by one or more sources of mixed gaseous reactants.

19. The gas distribution system of claim 18, wherein the at least one gas distributor includes a top gas distributor disposed in the upper portion of the plasma reaction chamber above the substrate and a bottom gas distributor disposed in the lower portion of the plasma reaction chamber below and peripheral to the substrate holder circumference.

* * * * *